United States Patent [19]

Staples

[11] Patent Number: 4,464,639

[45] Date of Patent: Aug. 7, 1984

[54] FERROELECTRIC SURFACE ACOUSTIC WAVE DEVICES

[75] Inventor: Edward J. Staples, Thousand Oaks, Calif.

[73] Assignee: Rockwell International Corporation, El Segundo, Calif.

[21] Appl. No.: 419,272

[22] Filed: Sep. 17, 1982

[51] Int. Cl.³ .................... H03H 9/145; H03H 9/64; H03H 9/68

[52] U.S. Cl. .................................. 333/154; 333/193; 333/196; 29/25.35

[58] Field of Search .............................. 333/150–155, 333/193–196; 29/25.35; 310/313 R, 313 A, 313 B, 313 C, 313 D

[56] References Cited

U.S. PATENT DOCUMENTS

| | | | |
|---|---|---|---|
| 2,724,171 | 11/1955 | Wallace | 29/25.35 |
| 3,713,036 | 1/1973 | Thomann | 333/154 X |
| 3,750,056 | 7/1973 | Subramanian | 333/193 |
| 3,805,195 | 4/1974 | Miller | 333/150 |
| 3,945,099 | 3/1976 | Kansy | 333/150 X |

OTHER PUBLICATIONS

Staples, et al., A Review of Device Technology for Programmable Surface-Wave Filters, IEEE Trans. Microwave Theor., vol. MTT-21, No. 4, p. 279, (Apr. 1973).

Primary Examiner—Marvin L. Nussbaum
Attorney, Agent, or Firm—H. Fredrick Hamann; Craig O. Malin; John J. Deinken

[57] ABSTRACT

Disclosed is a surface acoustic wave filter based on a ferroelectric crystal having a plurality of ordered domains of alternating polarity. An output interdigital transducer, with at least one pair of electrodes, is deposited on a surface of the crystal so that each of the electrode pairs corresponds to one of the ordered domains, and an input interdigital transducer is oriented on the surface to direct a surface acoustic wave toward the output transducer. In addition, sources of both positive and negative electrical potential may be provided, with a switch for each output electrode pair to selectably apply either the positive or the negative potential to that pair.

3 Claims, 8 Drawing Figures

FERROELECTRIC SURFACE ACOUSTIC WAVE DEVICES

GOVERNMENT RIGHTS

The Government has rights in this invention pursuant to a contract with the U.S. Air Force.

BACKGROUND OF THE INVENTION

This invention relates to surface acoustic wave devices which utilize ferroelectric crystals.

A surface acoustic wave is one of several types of wave motion in which acoustic energy can travel through a solid medium. Whereas bulk acoustic waves propagate through the interior of an acoustically conductive medium as either longitudinal or shear waves, surface waves are a complex mixture of shear and longitudinal wave motions which may occur only in the presence of a stress free boundary condition, such as at a surface. Because of this boundary condition, surface wave energy extends only a few wavelengths into the bulk of the propagating medium. This surface concentration of wave energy makes possible a variety of applications for surface wave devices in the field of electronics, such as signal filtering, the amplification of weak signals, the storage of signals in delay lines, the provision of highly accurate frequency references, and the detection of changes in a physical parameter, such as pressure or temperature.

Many practical applications for surface acoustic wave devices have appeared since the development of the interdigital transducer, which can effeciently convert an electrical signal into a surface acoustic wave and vice versa. The simplest interdigital transducer consists of a pair of interleaved electrodes which are placed in electrical contact with the surface of a piezoelectric material. When such a material is physically distorted, it produces an internal electric field. Conversely, if an electric field is applied to a piezoelectric material, the material will expand or contract, depending upon the polarity of the applied field. Because of this phenomenon, when a rapidly changing electrical signal is applied to a piezoelectric material through an interdigital transducer, the material will vibrate in response, thereby generating a surface acoustic wave. A single pair of interdigital electrodes will not produce surface acoustic waves with great efficiency, but multiple pairs of electrodes, when placed in an interdigitating pattern, will each excite an acoustic wave and, if the spacing between the electrodes is properly related to the desired acoustic wavelength, the separately excited waves can be made to reinforce one another and produce a suitably large acoustic signal.

If the frequency of the electrical input signal is altered from the ideal value, the individual excitations from each pair of electrodes will tend to cancel. The larger the number of electrode pairs, the more a slight change in frequency will tend to cancel the excited wave. This characteristic can be exploited in a filter by providing an input interdigital transducer and an output interdigital transducer in a delay line configuration, to sort out electrical signals of one frequency from other signals. By tapering the spacing between the electrodes and the length of the electrodes, the coupling of any particular pair of electrodes can be varied and coupling as a function of frequency can be controlled.

Considerable interest has arisen in the use of surface acoustic waves for signal processing functions, an application which requires interdigital transducers having electrode geometries and spacings designed to sample the acoustic signal at particular points. In the case of an analog signal whose frequency varies as some particular function of time, for example, an interdigital transducer can be tailored to recognize the signal by selecting proper spacing and electrode lengths at different positions along the transducer.

Another signal processing application for surface acoustic waves involves the tapped delay line, which responds to particular digital codes. A tapped delay line includes a uniform array of electrode pairs deposited on a suitable substrate. A signal in the form of a short pulse introduced by means of a wideband transducer at one end of the delay line will generate an electrical output at each electrode pair in the array as it propagates past that pair. If the electrical outputs of these electrodes are all connected together, a series of successive pulses, analogous to ones in binary code, will result. If some of the connections are reversed, however, the corresponding pulses will be reversed in polarity and will be equivalent to zeros in the binary system. This technique can be utilized to produce a coded digital signal for transmission and to recognize such a received signal, since an identically connected array of transducers will produce a large electrical output signal when the coded acoustic signal is sent into the array. Such a device can be made programmable by providing a switch for each electrode pair to control the polarity of that pair. This addition makes feasible the production of high speed signal processors with a large number of taps which can be rapidly switched to respond to complex and changing coded signals.

The development of these surface acoustic wave devices has been limited by the techniques available in the art for fabricating interdigital transducers. In the case of an analog filter, for example, the electrode sizes and spacing must be fixed at the time of fabricating the transducer and cannot readily be later altered to adapt the filter to respond to different signals than the particular one for which the filter was designed. One of the difficulties which has arisen with programmable tapped delay lines involves the switches used for changing the polarity of the individual electrode pairs. In prior art designs, these switches must handle radio frequency signals, making the design of such switches more complicated and reducing the efficiency of the device. These lamitations of the prior art are illustrative of some of the problems which are solved by the techniques of the present invention.

SUMMARY OF THE INVENTION

It is general objective of this invention to provide a new and improved technique for generating and detecting surface acoustic waves.

A method of polarizing a ferroelectric crystal according to this invention includes the steps of heating the crystal to above its transition temperature and applying an electrical potential to selected regions of a surface of the crystal to establish a spatially alternating electric field in the surface and thereby create a plurality of ordered domains of alternating polarity.

If the crystal is to be operated in the ferroelectric range, the method may include the additional steps of cooling the crystal to below the transition temperature and removing the applied potential. The step of applying an electrical potential may be accomplished by applying an electrical potential to an interdigital transducer on the surface.

A surface acoustic wave may be generated by applying an AC potential to the interdigital transducer, either above the transition temperature with the electrical potential applied or below the transition temperature without the applied potential.

A surface acoustic wave filter may be made according to the invention by depositing an input interdigital transducer, including at least one pair of input electrodes, on a surface of a ferroelectric crystal and depositing an output transducer, with at least one pair of output electrodes, on the surface. The crystal is then heated to above its transition temperature and a predetermined electrical potential is applied across each pair of input and output electrodes to establish a spatially alternating electric field in the surface and thereby create a plurality of ordered domains of alternating polarity. The crystal is then cooled to below the transition temperature and the applied potential is removed.

In an alternative design, sources of positive and negative electrical potential are provided and a switch for each pair of output electrodes can selectably apply either the positive or negative potential to that pair while the crystal is above its transition temperature. Specifically, one of the ferroelectric materials which can be used in this invention is strontium barium niobate.

BRIEF DESCRIPTION OF THE DRAWINGS

Additional objectives, features, and advantages of this invention will be evident from the detailed description below and the attached drawings, in which.

DETAILED DESCRIPTION OF THE INVENTION

A ferroelectric crystal exhibits an electric dipole moment in the absence of an external electric field. This phenomena occurs because, in the ferroelectric state, the center of positive charge in the crystal structure does not coincide with the center of negative charge. Such a crystal generally consists of multiple domains which each have a polarization fixed in some random direction. All crystals which are in the ferroelectric state are also piezoelectric, i.e., a stress applied to the crystal will change its electric polarization and an applied electric field will cause an elastic strain in the crystal. Ferroelectricity, however, usually disappears above a particular temperature known as the transition or Curie temperature, at which a phase transformation occurs. Above the transition temperature the crystal is in the paraelectric state, in which the polarization of the domains is no longer fixed but can be aligned with an applied electric field.

In order to generate acoustic waves in a ferroelectric crystal using the piezoelectric mechanism, the domain polarizations within the crystal must be ordered. The conventional way to accomplish this is to raise the temperature of the crystal above the transition temperature, apply an electric field between opposite faces or edges of the crystal, then lower the temperature to below the transition temperature while maintaining the applied voltage. This procedure polarizes the domains within the crystal along a uniform electric field parallel to the polar axis of the crystal.

Figure 1:
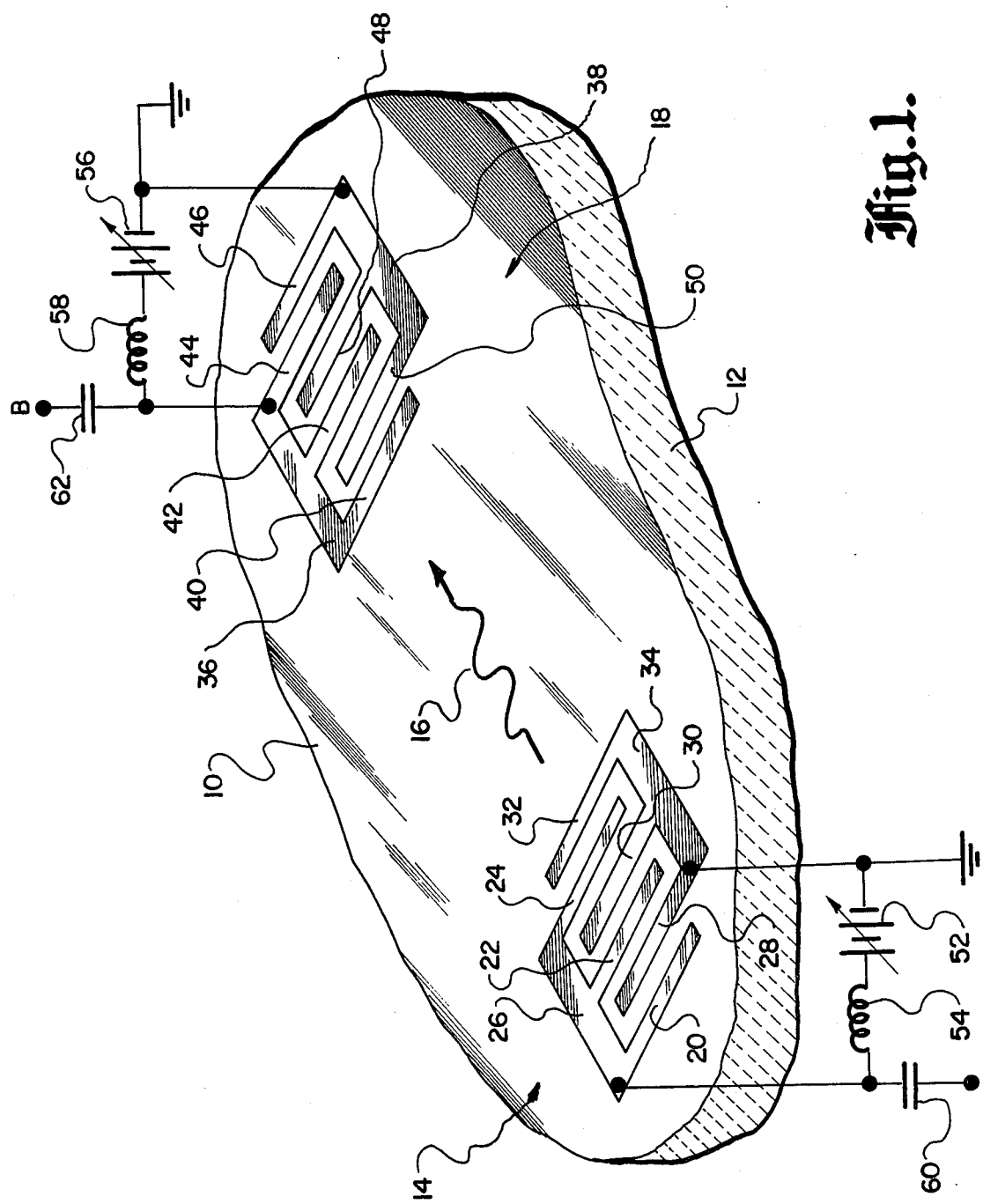
FIG. 1 is a perspective view of a surface acoustic wave delay line fabricated on a ferroelectric crystal according to the present invention.

Contrary to this teaching in the prior art, it is an outstanding feature of the present invention to arrange the domains in a ferroelectric crystal by establishing a spatially alternating electric field in a surface of the crystal, thereby creating a plurality of ordered domains of alternating polarity. The preferred technique for accomplishing this is by means of an interdigital transducer, as shown in FIG. 1. FIG. 1 is a perspective view of a surface acoustic wave (SAW) delay line fabricated on a surface 10 of a ferroelectric crystal 12. The delay line consists of an input interdigital transducer 14, which generates surface acoustic waves 16 in the crystal, and an output interdigital transducer 18 for detecting the waves. The input transducer 14 includes three pairs of electrodes, with one electrode of each pair, namely electrodes 20, 22, and 24, connected to a first bus 26, and the second electrode of each pair, i.e., electrodes 28, 30, and 32, connected to a second bus 34. Similarly, the output transducer includes buses 36 and 38 and electrodes 40, 42, 44, 46, 48, and 50. (As those skilled in the art will appreciate, however, actual devices will generally include interdigital transducers with a larger number of electrode pairs.)

Figure 2:
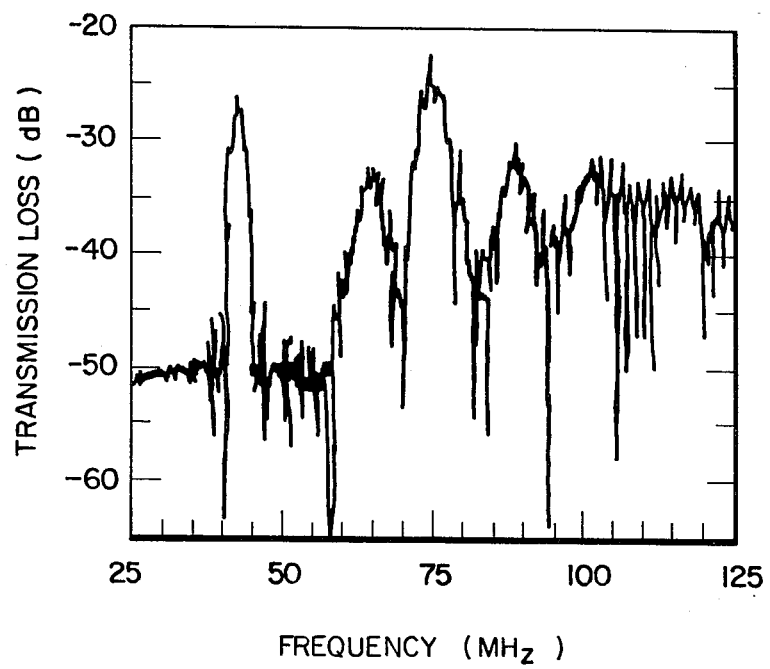
FIG. 2 is a plot of the delay line transmission response which was measured for the delay line of FIG. 1 with a uniform polarization of the crystal.
Figure 3:
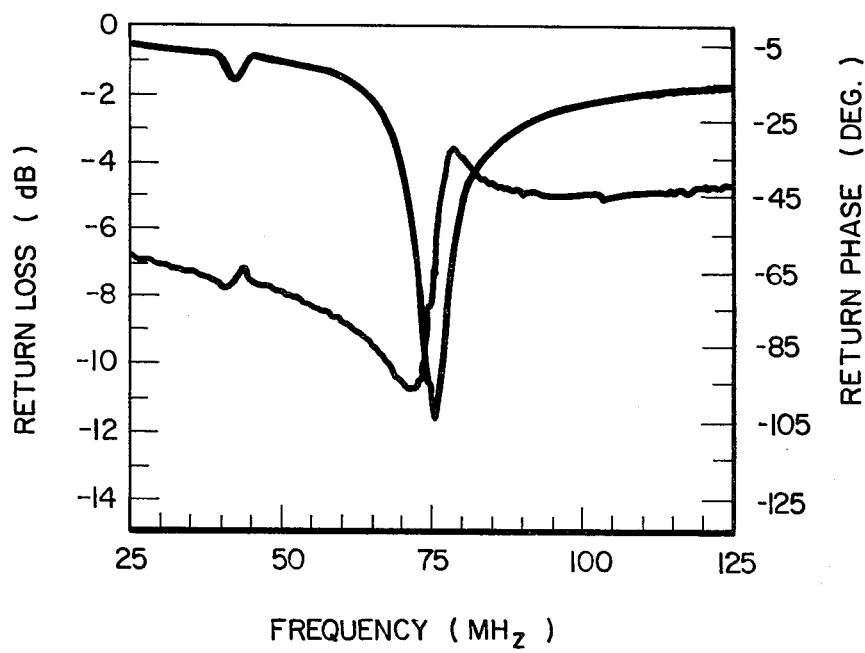
FIG. 3 is a plot of the loss and phase of the return signal corresponding to the transmission loss shown in FIG. 2.

In one embodiment of the present invention, a delay line was fabricated on (110) cut $Sr_{0.61} Ba_{0.39} Nb_2O_6$, with Saw propagation along the z direction of this solid solution crystal. Input and output interdigital transducers having 15 electrode pairs were deposited on the crystal with electrode widths of 0.001" and spacing of 0.001". Initially the crystal was polarized in the conventional manner using a Z-axis directed electric field of 1–5 kV/cm at a temperature of 100° C. for one hour (the transition temperature for this material is approximately 70° C.). The crystal was then cooled to room temperature and the electric field was removed. At this point the crystal was tested as an acoustic wave mode resonator. The delay line transmission response which was obtained is plotted in FIG. 2, which indicates coupling to surface waves at 42 MHz and to bulk waves in the range from 60–125 MHz. The corresponding transducer return loss which was measured is plotted in FIG. 3, along with a plot of the phase of the returned signal. These results demonstrated that surface acoustic waves were generated via a piezoelectric mechanism as the result of the uniform polarization which had been frozen into the crystal.

The crystal was then heated to above its transition temperature and the SAW characteristics of the device were compared for different amounts of applied polarizing voltage. The experimental arrangement was as indicated in FIG. 1, with a polarizing voltage applied to the input transducer 14 by means of a first voltage source 52 through a first RF coil 54. A polarizing voltage could be applied to the output transducer 18 by a second voltage source 56 acting through a second RF coil 58. The input RF signal was applied to terminal A through an input capacitance 60, while the electrical output from the transducer 18 was measured at terminal B through an output capacitance 62.

Figure 4:
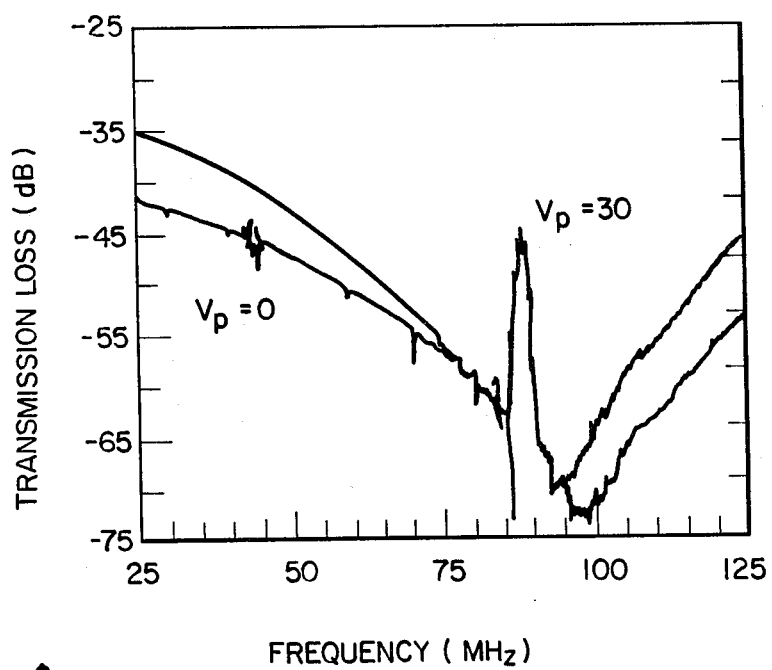
FIG. 4 is a plot of the transmission loss for the delay line of FIG. 1 operating in the paraelectric range, with no applied voltage and with a polarization voltage applied according to the present invention.

With the device operating at 130° C. in the paraelectric range, no delay line response was observed when no polarizing voltage was applied, as indicated by the transmission loss plotted in FIG. 4 for $V_P=0$. (The pronounced dip in this plot at approximately 100 MHz is believed due to an unusual amount of inductance which appeared to arise from conduction within the crystal.) When a polarizing voltage of 30 VDC was applied to the transducer electrodes, however, the net polarization induced in the crystal in the region of the transducers facilitated the generation of surface acoustic waves. These waves, as indicated in the plot of FIG. 4 labelled $V_P32$ 30, were generated at 88 MHz, approximately twice the original frequency, which was a direct result of the effectively doubled periodicity of the transducer due to the alternating directions of the interdigital polarizing field.

Figure 5:
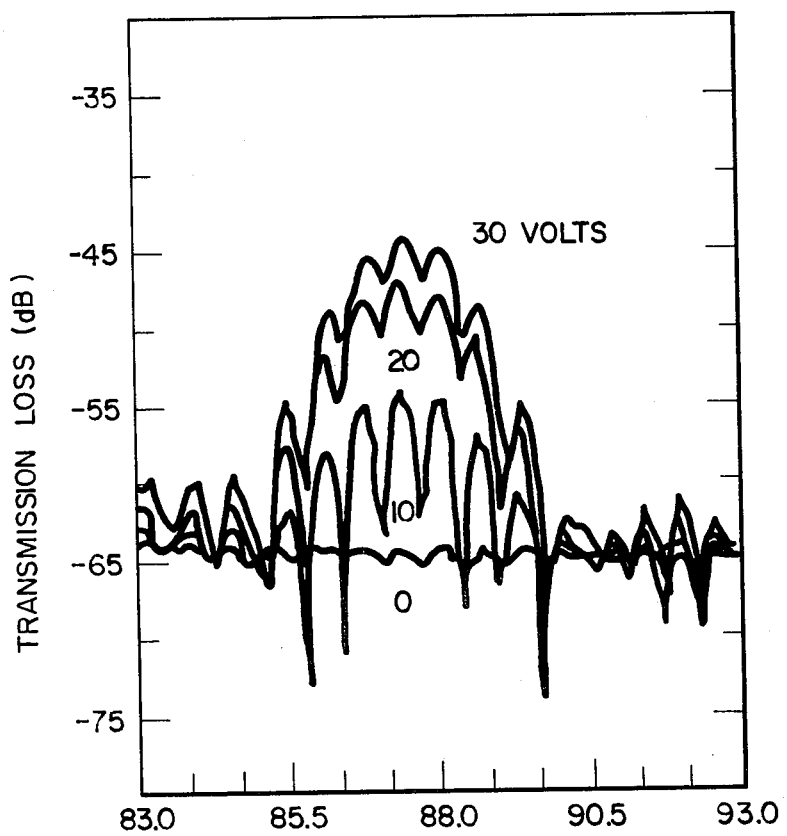
FIG. 5 is a plot similar to FIG. 4, but showing the transmission loss for several different values of applied voltage.

Changing the amplitude of the applied DC potential with the crystal in the paraelectric temperature range caused the amplitude of the delay line response to vary in a linear fashion for potentials up to 20 Volts (10 KV/cm). Beyond 20 Volts the effect showed signs of saturation at a value of 30 Volts. A plot of the transmission response for several values of the applied potential is shown in FIG. 5. As will be explained further below, this characteristic of the device provides the basis for a voltage controlled filter.

Figure 6:
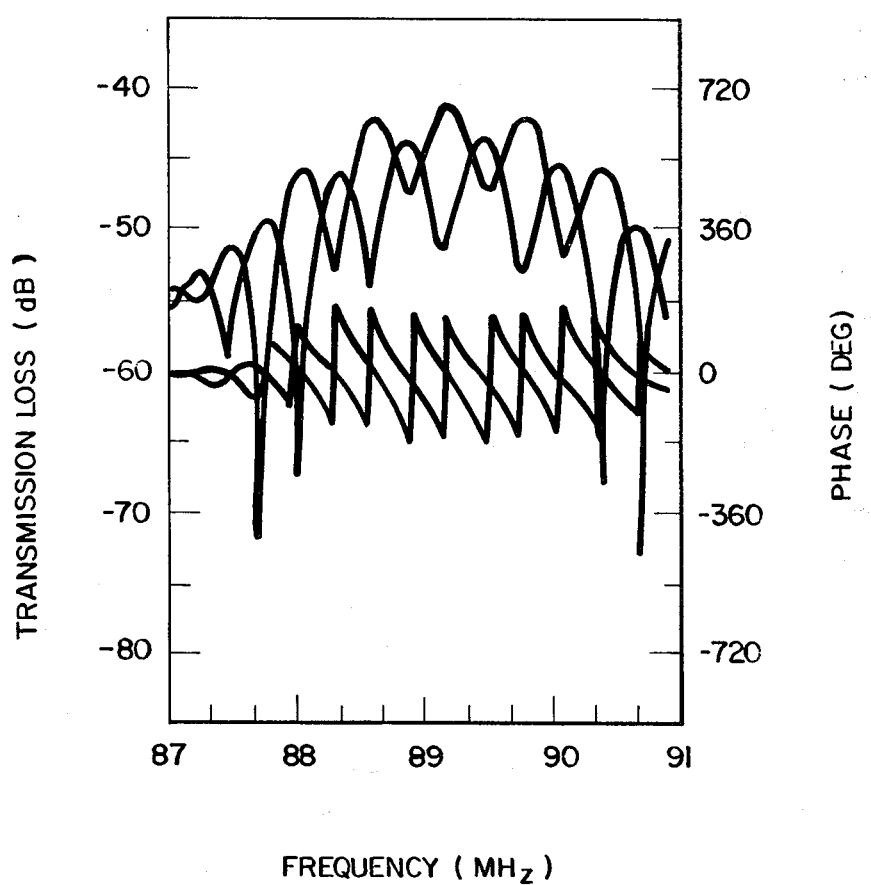
FIG. 6 includes plots of transmission loss and the phase of the transmitted signal in the paraelectric range for positive and negative applied polarization voltages.

The sign of the applied DC potential was then altered, which caused a 180° phase reversal in the transducer output, as shown in FIG. 6, which is a plot of the transmission loss and the phase for both positive and negative applied DC potentials. Although the exact switching speed was not measured, it was determined that this speed was considerably less than 100 ns. This phase reversing property of the device can be used in the construction of a phase programmable filter, as further explained below.

The device was then slowly cooled to room temperature while maintaining the applied bias potential at 30 VDC. The transmission characteristics were measured and it was found that the bulk mode waves were eliminated, with the surface acoustic waves continuing to be generated at twice the interdigital transducer frequency. These results established that a pattern of alternating polarization domains can be frozen in the surface of a ferroelectric crystal while the remainder of the crystal retains random domains.

Figure 7:
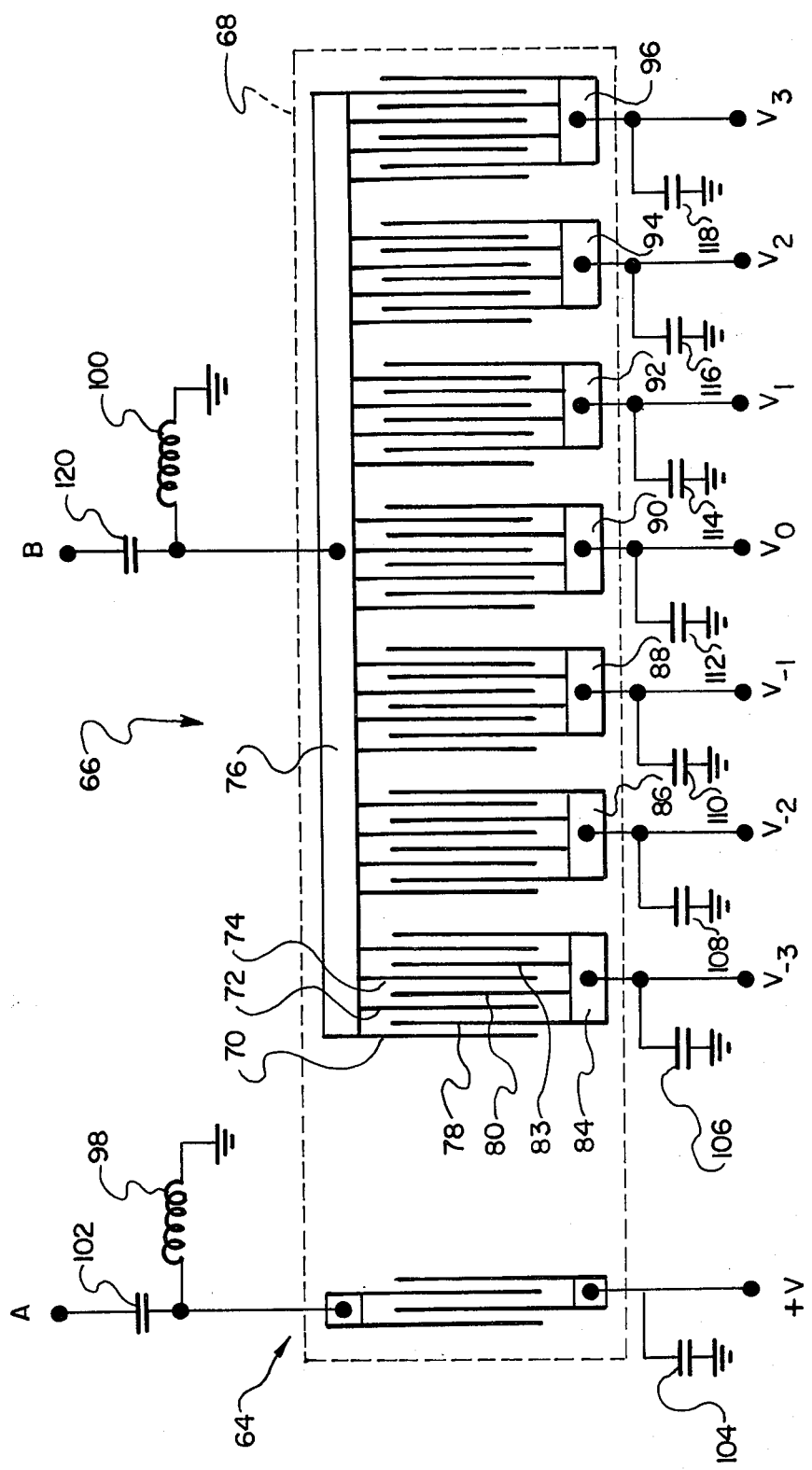
FIG. 7 is a schematic diagram of a tunable bandpass filter constructed according to this invention.

One embodiment of a tunable bandpass filter constructed according to the present invention is shown in schematic form in FIG. 7. This device includes an input interdigital transducer 64 and an output interdigital transducer 66 deposited on the surface of a ferroelectric crystal, as indicated by the dotted line 68. The output transducer includes a first series of electrodes, such as electrodes 70, 72, and 74, which are connected to a first bus 76. A second series of electrodes, such as electrodes 78, 80, and 82, alternate in the electrode pattern with the electrodes of the first series. The second series electrodes are not connected in common but are connected in contiguous groups to a series of busses 84, 86, 88, 90, 92, 94, and 96. In order to tune the filter, the crystal is heated above its transition temperature, a polarizing voltage V is applied to the input transducer 64, and an RF signal is applied at terminal A so that the input transducer will generate a surface acoustic wave in the crystal. Voltages $V_{-3}$, $V_{-2}$, $V_{-1}$, $V_0$, $V_1$, $V_2$, and $V_3$ are then applied to the busses 84-96 and adjusted until the desired shape factor or other performance criteria is attained in the output signal measured at terminal B. Inductances 98 and 100, and capacitances 102, 104, 106, 108, 110, 112, 114, 116, 118, and 120 are provided to isolate the RF signal from the DC polarizing voltages. The crystal is then cooled to ambient temperature (below the transistion temperature) and the polarizing voltages are removed, the desired response having been set by freezing the established domain pattern into the surface of the crystal.

This method of obtaining a particular frequency response could be useful in the manufacture of optimized filters for many applications, including, for example, bandpass filters, phase or modulation shift coding, chirping, IF filters, and resonators. Besides enabling the tuning of a standarized structure to many different responses, this filter can be operated at twice the frequency of conventional surface acoustic wave devices, for a given interdigital transducer electrode spacing, because of the doubling effect inherent in the polarizing technique of this invention.

Figure 8:
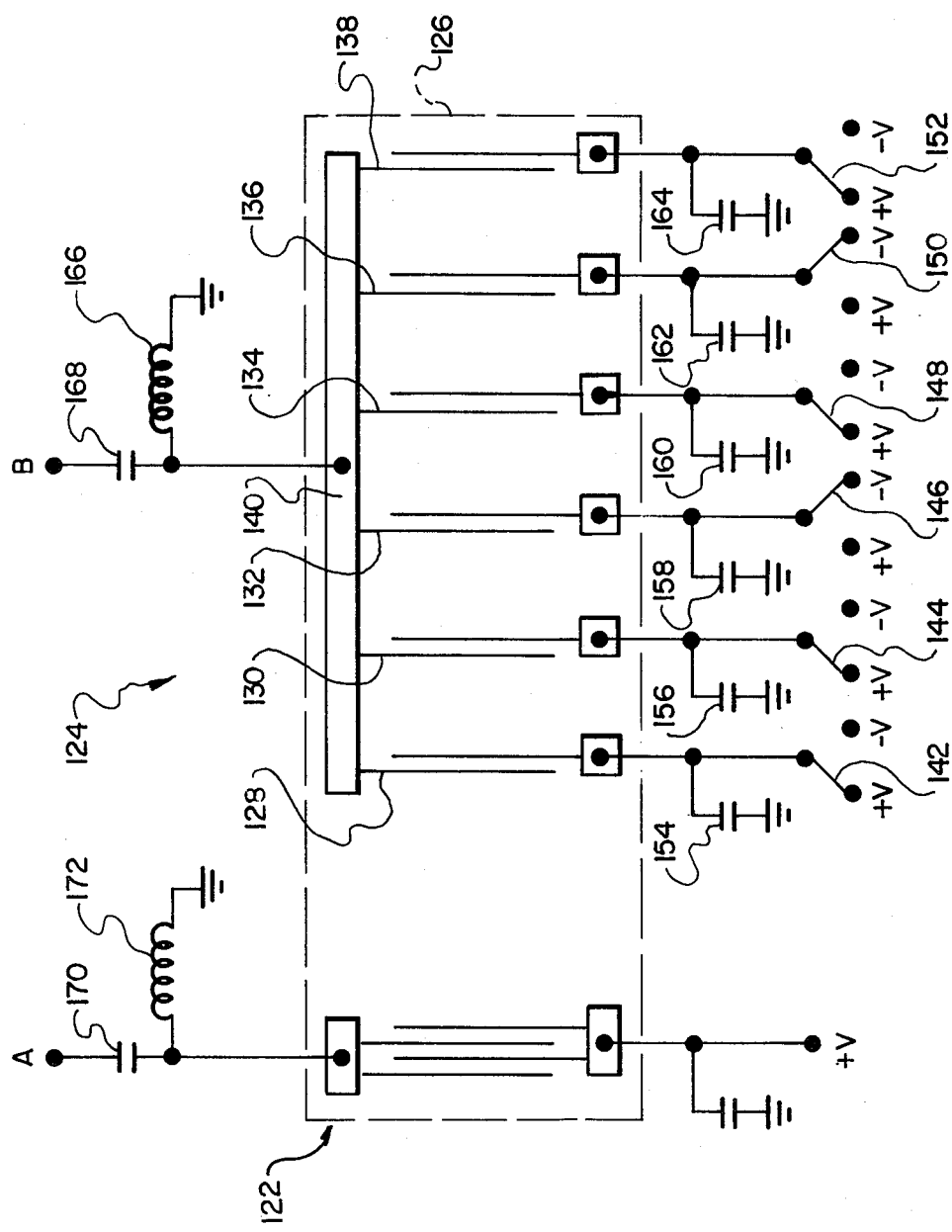
FIG. 8 is a schematic of a programmable matched filter constructed according to the invention.

Another embodiment of this invention is shown in FIG. 8, which is a schematic of a surface acoustic wave programmable matched filter. In its simplest form, the programmable surface acoustic wave filter consists of a delay line substrate which has a wideband input transducer and a series of taps which are located at arbitrarily specified intervals down the propagation path. Parallel summation of the output from each tap forms a transversal filter configuration. In the general case, both the amplitude and phase of each tap are programmable variables. In the conventional filter designs, the phase of each tap is usually programmed by diode switches. The presence of these RF switching elements can seriously degrade the total insertion loss of the filter. The present invention, however, eliminates the need for RF switching in such a filter. In FIG. 8, an input interdigital transducer 122 and an output interdigital transducer 124 are deposited on a ferroelectric crystal, as indicated by the dotted line 126. One electrode in each electrode pair of the output transducer, i.e., electrodes 128, 130, 132, 134, 136, and 138, is connected to a bus 140. Each electrode pair, however, is individually tapped, by DC switches 142, 144, 146, 148, 150, and 152. Isolation is provided by capacitances 154, 156, 158, 160, 162, and 164. This programmable filter is designed to operate with the crystal above its transition temperature so that it is in the paraelectric range. A polarizing voltage +V is applied to the input transducer 122 and the RF signal is applied at terminal A. The appropiate coding can then be selected by low power DC switching of the switches 142-152 between +V and −V to shift the phase of the surface acoustic wave detected by each electrode pair by 180°. The output signal is detected, through an output matching inductance 166 and capacitance 168, at terminal B. The RF signal is not switched or routed by any external circuitry, offering the advantages of high yield and low loss.

Although some typical embodiments of the invention have been illustrated and discussed above, modifications and additional embodiments of the invention will undoubtedly be apparent to those skilled in the art. Various changes may be made in the configuration, size, and arrangement of the components of the invention without departing from the scope of the invention. Furthermore, equivalent elements may be substituted for those illustrated and described herein, parts and connections might be reversed or otherwise interchanged, and certain features of the invention might be utilized independently of other features. Consequently, the examples presented herein should be considered as illustrative only and not inclusive, the appended claims being more indicative of the full scope of the invention.

What is claimed is:

1. A surface acoustic wave device, comprising:
   a ferroelectric strontium barium niobate crystal having a plurality of ordered domains of alternating polarity;
   an output interdigital transducer, including at least one pair of electrodes, disposed on a surface of said crystal, each of said electrode pairs corresponding to one of said domains;
   an input interdigital transducer disposed on said surface and oriented to direct a surface acoustic wave toward said output transducer.

2. A surface acoustic wave device, comprising:
   a ferroelectric strontium barium niobate crystal having a plurality of ordered domains of alternating polarity;
   an interdigital transducer, including at least one pair of electrodes, disposed on a surface of said crystal, each of said electrode pairs corresponding to one of said domains;
   a source of positive electrical potential;
   a source of negative electrical potential; and
   a switch for each of said electrode pairs to selectably apply either said positive source or said negative source across each pair to establish a spatially alternating electric field in said surface and thereby create said plurality of ordered domains.

3. A surface acoustic wave filter, comprising:
   a ferroelectric strontium barium niobate crystal;
   an output interdigital transducer, including at least one pair of output electrodes, disposed on a surface of said crystal;
   an input interdigital transducer, including at least one pair of input electrodes, disposed on said surface and oriented to direct a surface acoustic wave toward said output transducer;
   a source of positive electrical potential;
   a source of negative electrical potential; and
   a switch for each of said output electrode pairs to selectably apply either said positive source or said negative source across each pair to establish a spatially alternating electric field in said surface and thereby create a plurality of ordered domains in said surface.

* * * * *